(12) United States Patent
Yuk

(10) Patent No.: US 11,360,501 B2
(45) Date of Patent: Jun. 14, 2022

(54) REFERENCE VOLTAGE GENERATION CIRCUIT

(71) Applicant: SK hynix Inc., Gyeonggi-do (KR)

(72) Inventor: Young Sub Yuk, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 10 days.

(21) Appl. No.: 16/939,658

(22) Filed: Jul. 27, 2020

(65) Prior Publication Data

US 2021/0303012 A1    Sep. 30, 2021

(30) Foreign Application Priority Data

Mar. 31, 2020  (KR) .................. 10-2020-0038832

(51) Int. Cl.
*G05F 1/46*  (2006.01)
*G05F 1/59*  (2006.01)
*G05F 1/575*  (2006.01)

(52) U.S. Cl.
CPC .............. *G05F 1/465* (2013.01); *G05F 1/575* (2013.01); *G05F 1/59* (2013.01)

(58) Field of Classification Search
CPC . G05F 1/465; G05F 1/59; G05F 1/575; G05F 3/222–245
See application file for complete search history.

(56) References Cited

U.S. PATENT DOCUMENTS

| 7,193,454 B1* | 3/2007 | Marinca | G05F 3/30 327/538 |
| 7,453,252 B1* | 11/2008 | Megaw | G05F 3/30 323/313 |
| 9,753,482 B2* | 9/2017 | Niederberger | G05F 3/30 |
| 9,933,797 B1* | 4/2018 | Lebon | G05F 1/468 |
| 10,411,597 B1* | 9/2019 | Far | G05F 3/08 |
| 2002/0158682 A1* | 10/2002 | Conte | G05F 3/30 327/539 |
| 2008/0001654 A1* | 1/2008 | Byeon | G05F 1/465 327/541 |
| 2012/0169413 A1* | 7/2012 | Choi | G05F 3/30 327/539 |
| 2013/0033305 A1* | 2/2013 | Fukazawa | G05F 1/567 327/539 |

(Continued)

FOREIGN PATENT DOCUMENTS

| CN | 106527571 A | 3/2017 |
| CN | 108345336 A | 7/2018 |

(Continued)

OTHER PUBLICATIONS

Office Action issued by the Chinese Patent Office dated Apr. 7, 2022.

*Primary Examiner* — Sisay G Tiku
(74) *Attorney, Agent, or Firm* — IP & T Group LLP

(57) ABSTRACT

A reference voltage generation circuit may include: a first reference current path formed through a first node and a first transistor; a second reference current path formed through a second node and a second transistor; a first feedback loop configured to feed a first current back to the first and second reference current paths such that voltage levels of the first and second nodes are kept the same; and a second feedback loop configured to control the currents flowing through the first and second transistors according to a second current.

17 Claims, 4 Drawing Sheets

(56) References Cited

U.S. PATENT DOCUMENTS

| | | | | |
|---|---|---|---|---|
| 2013/0169259 A1* | 7/2013 | Saxena | ............... | G05F 3/30 |
| | | | | 323/313 |
| 2013/0241523 A1* | 9/2013 | Youssefi | ............... | G05F 3/30 |
| | | | | 323/313 |
| 2014/0070788 A1* | 3/2014 | Pottbaecker | ............... | G05F 3/30 |
| | | | | 323/313 |
| 2014/0239936 A1* | 8/2014 | Paglino | ............... | G05F 3/26 |
| | | | | 323/313 |
| 2016/0327972 A1* | 11/2016 | Ippolito | ............... | G05F 3/30 |

FOREIGN PATENT DOCUMENTS

| KR | 10-0545711 | 1/2006 |
|---|---|---|
| KR | 10-0638487 | 10/2006 |
| KR | 10-0756317 | 9/2007 |

* cited by examiner

REFERENCE VOLTAGE GENERATION CIRCUIT

CROSS-REFERENCE TO RELATED APPLICATION

The present application claims priority under 35 U.S.C. § 119(a) to Korean application number 10-2020-0038832, filed on Mar. 31, 2020, in the Korean Intellectual Property Office, which is incorporated herein by reference in its entirety.

BACKGROUND

1. Technical Field

Various embodiments generally relate to a semiconductor circuit, and more particularly, to a reference voltage generation circuit.

2. Related Art

It is necessary for a semiconductor circuit to use a reference voltage in order to process various signals and to supply power.

In a semiconductor circuit, for example, a volatile memory such as a dynamic random access memory (DRAM), a nonvolatile memory such as NAND flash, or a memory controller for controlling a memory, a reference voltage level needs to be constantly retained regardless of external voltage variation or/and temperature change, in order to raise the operation performance reliability of a product incorporating the semiconductor circuit.

SUMMARY

Various embodiments are directed to a reference voltage generation circuit capable of generating a reference voltage at a stable level.

In an embodiment, a reference voltage generation circuit may include: a first reference current path formed through a first node and a first transistor; a second reference current path formed through a second node and a second transistor; a first feedback loop configured to feed a first current back to the first and second reference current paths such that voltage levels of the first and second nodes are kept the same; and a second feedback loop configured to control the amounts of currents flowing through the first and second transistors according to a second current.

In an embodiment, a reference voltage generation circuit may include: a reference circuit configured to generate a first internal voltage, a second internal voltage and a pre-reference voltage, each of which is controlled to be a target value, by compensating for an offset caused by at least one of temperature change and voltage change, according to a first current and a second current; an amplifier circuit configured to amplify a voltage difference between the first and second internal voltages, and output an amplification signal; and a current control circuit configured to control the first and second currents according to the amplification signal.

In an embodiment, a reference voltage generation circuit may include: a reference circuit configured to generate a first internal voltage, a second internal voltage and a pre-reference voltage, each of which is controlled to be a target value, by compensating for an offset caused by at least one of temperature change and voltage change, according to a first current and a second current, each of which has a first characteristic, and a third current which has the first characteristic but has a different current variation ratio than either of the first and second currents; an amplifier circuit configured to amplify a voltage difference between the first and second internal voltages, and output an amplification signal; and a current control circuit configured to control the first and second currents according to the amplification signal.

DETAILED DESCRIPTION

Hereafter, various embodiments of the present disclosure are described in more detail with reference to the drawings. Throughout the specification, reference to "an embodiment," "another embodiment" or the like is not necessarily to only one embodiment, and different references to any such phrase are not necessarily to the same embodiment(s).

Figure 1:
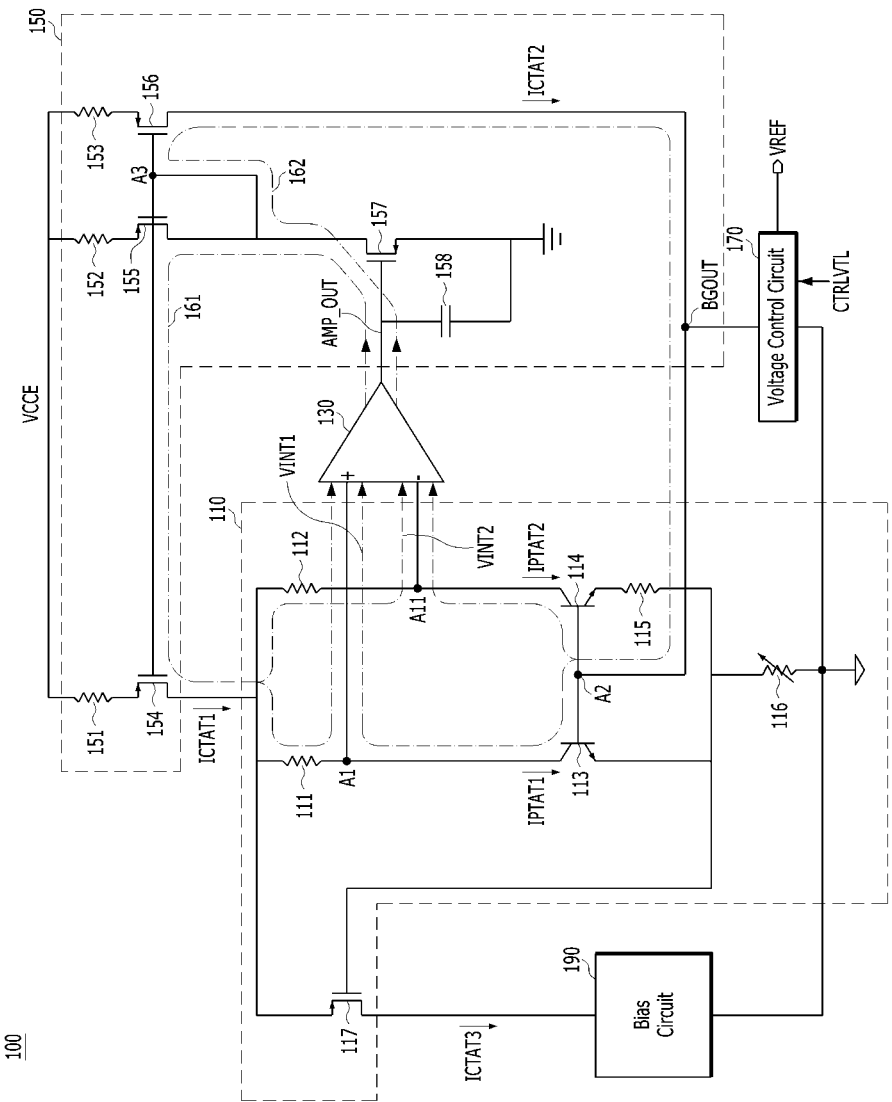
FIG. 1 is a diagram illustrating a configuration of a reference voltage generation circuit in accordance with an embodiment.

FIG. 1 is a diagram illustrating a configuration of a reference voltage generation circuit 100 in accordance with an embodiment.

Referring to FIG. 1, the reference voltage generation circuit 100 may include a reference circuit 110, an amplifier circuit 130, a current control circuit 150 and a voltage control circuit 170.

The reference voltage generation circuit 100 may further include a bias circuit 190.

The reference circuit 110 may generate a first internal voltage VINT1, a second internal voltage VINT2 and a pre-reference voltage BGOUT, each of which is controlled to be generated and kept at a target value, by compensating for an offset caused by temperature change and voltage change, according to a first current ICTAT1 and a second current ICTAT2.

The reference circuit 110 may include first to fourth resistors 111, 112, 115 and 116 and first and second transistors 113 and 114.

The first resistor 111 may have one end coupled to the current control circuit 150 and configured to receive the first current ICTAT1 and the other end coupled to a first node A1.

The first internal voltage VINT1 may be applied to the first node A1.

The second resistor 112 may have one end coupled to the current control circuit 150 and configured to receive the first current ICTAT1 and the other end coupled to a second node A11.

The first and second resistors 111 and 112 may be designed to have the same resistance value.

The second internal voltage VINT2 may be applied to the second node A11.

Each of the first and second transistors 113 and 114 may be configured as a bipolar junction transistor (BJT).

The first transistor 113 may have a collector coupled to the first node A1 and a base coupled to the third node A2.

A third current IPTAT1 flows through a current path formed through the first resistor 111, the first node A1 and the collector of the first transistor 113, which may be referred to as a first reference current path.

The pre-reference voltage may be applied to the third node A2.

The second transistor 114 have a collector coupled to the second node A11 and a base coupled to the third node A2.

A fourth current IPTAT2 flows through a current path formed through the second resistor 112, the second node A11 and the collector of the second transistor 114, which may be referred to as a second reference current path.

The third resistor 115 may have one end coupled to an emitter of the second transistor 114.

The fourth resistor 116 may be a variable resistor, the resistance value of which is set to a default value and the resistance value can be varied according to an external control.

One end of the fourth resistor 116 may be coupled to the node formed by the emitter of the first transistor 113 and the downstream end of the third resistor 115, and the other end of the fourth resistor 116 may be coupled to a ground terminal.

The reference circuit 110 may further include a third transistor 117.

The third transistor 117 may be a MOS transistor.

The third transistor 117 may have a source coupled to the current control circuit 150 and configured to receive the first current ICTAT1 and a gate coupled to the one end of the fourth resistor 116.

The third transistor 117 may have a drain coupled to the bias circuit 190.

A current flowing into the bias circuit 190 through the third transistor 117 is denoted a fifth current ICTAT3.

The first current ICTAT1, the second current ICTAT2 and the fifth current ICTAT3 are complementary to absolute temperature (CTAT)-type currents that decrease as the ambient temperature rises.

The third current IPTAT1 and the fourth current IPTAT2 are proportion to absolute temperature (PTAT)-type currents that increase as the ambient temperature rises.

Since the first and second resistors 111 and 112 having the same resistance value are coupled to the collector of the first transistor 113 and the collector of the second transistor 114 through the first and second nodes A1 and A11, respectively, the amount of the third current IPTAT1 flowing through the first reference current path and the amount of the fourth current IPTAT2 flowing through the second reference current path may be controlled to be the same.

Since the third and fourth currents IPTAT1 and IPTAT2 are equal, the voltage levels of the first and second nodes A1 and A11 may be matched with each other, i.e., controlled to be the same.

The amplifier circuit 130 may amplify a voltage difference between the first and second internal voltages VINT1 and VINT2, and output an amplification signal AMP_OUT corresponding to the amplified voltage difference.

The amplifier circuit 130 may receive the first internal voltage VINT1 through a first input terminal (+) and receive the second internal voltage VINT2 through a second input terminal (−).

The current control circuit 150 may control the first and second currents ICTAT1 and ICTAT2 according to the amplification signal AMP_OUT.

The current control circuit 150 may include fifth to seventh resistors 151 to 153, fourth to seventh transistors 154 to 157 and a capacitor 158.

Each of the fourth to seventh transistors 154 to 157 may be a MOS transistor.

The upstream end of each of the fifth to seventh resistors 151 to 153 may be coupled to a power supply terminal VCCE in common.

The voltage of the power supply terminal VCCE may be provided externally.

The fourth transistor 154 may have a source coupled to the downstream end of the fifth resistor 151 and a drain coupled to the first resistor 111 of the reference circuit 110.

The fifth transistor 155 may have a source coupled to the downstream end of the sixth resistor 152 and a drain coupled to a fourth node A3.

The sixth transistor 156 may have a source coupled to the downstream end of the seventh resistor 153 and a drain coupled to the third node A2 of the reference circuit 110.

The gates of the fourth to sixth transistors 154 to 156 may be coupled to the fourth node A3 in common.

The seventh transistor 157 may have a drain coupled to the drain of the fifth transistor 155, a source coupled to the ground terminal, and a gate coupled to an output terminal of the amplifier circuit 130 and configured to receive the amplification signal AMP_OUT.

The capacitor 158 may be coupled between the gate and source of the seventh transistor 157.

The voltage control circuit 170 may generate a reference voltage VREF by controlling the level of the pre-reference voltage BGOUT according to a voltage control signal CTRLVTL.

The voltage control circuit 170 may be coupled between the third node A2 and the ground terminal.

The bias circuit 190 may generate a bias signal according to the fifth current ICTAT3.

The bias circuit 190 may be coupled between the drain of the third transistor 117 and the ground terminal.

The reference voltage generation circuit 100 in accordance with an embodiment may form a plurality of negative feedback loops, i.e. a first negative feedback loop (first feedback loop) 161 and a second negative feedback loop (second feedback loop) 162.

The reference voltage generation circuit 100 may control the first and second currents ICTAT1 and ICTAT2 by driving the first and second feedback loops 161 and 162 according to the amplification signal AMP_OUT, such that the reference voltage VREF has a constant level regardless of temperature change and/or variation in supply voltage.

The first feedback loop 161 may be constituted by components 157, 155 and 154 of the current control circuit 150, components 111 and 112 of the reference circuit 110, and the amplifier circuit 130.

The second feedback loop 162 may be constituted by components 157 and 156 of the current control circuit 150, s components 113 and 114 of the reference circuit 110, and the amplifier circuit 130.

The first feedback loop 161 may perform a negative feedback operation of feeding back the first current ICTAT1 having a characteristic opposite that of each of the third and fourth currents IPTAT1 and IPTAT2 according to the amplification signal AMP_OUT, such that the voltage levels of the first and second nodes A1 and A11 can be retained at a constant level regardless of temperature change. In the present embodiment, the characteristic of the first current is that it is a CTAT-type current, and the characteristic of each of the third and fourth currents is that each is a PTAT-type current. CTAT-type and PTAT-type currents are opposite in characteristic in that they react oppositely to temperature change.

The second feedback loop 162 may control the voltage levels of the bases of the first and second transistors 113 and 114 according to the second current ICTAT2 which is controlled by the amplification signal AMP_OUT.

Figure 2:
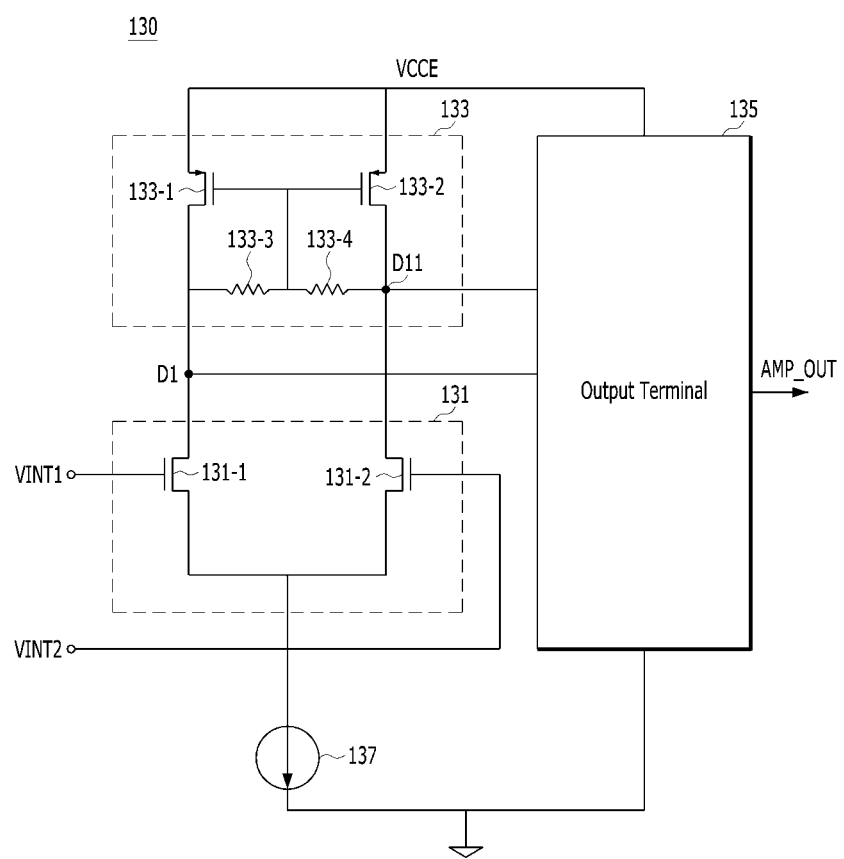
FIG. 2 is a diagram illustrating a configuration of an amplifier circuit, such as that of FIG. 1.

FIG. 2 is a diagram illustrating the configuration of the amplifier circuit 130 of FIG. 1.

Referring to FIG. 2, the amplifier circuit 130 may include a differential pair 131, a common mode feedback circuit 133 and an output terminal 135.

The differential pair 131 may be an N-channel-input differential pair.

The differential pair 131 may include first and second transistors 131-1 and 131-2.

Each of the first and second transistors 131-1 and 131-2 may be an NMOS transistor.

The first transistor 131-1 may have a drain coupled to a first output node D1, a gate configured to receive the first internal voltage VINT1, and a source coupled to a ground terminal through a current source 137.

The second transistor 131-2 may have a drain coupled to a second output node D11, a gate configured to receive the second internal voltage VINT2, and a source coupled to the ground terminal through the current source 137.

The differential pair 131 may be an N-channel-input differential pair. The N-channel-input differential pair may reduce an offset between output signals, i.e., an offset between the first and second output nodes D1 and D11, compared to a P-channel-input differential pair.

The common mode feedback circuit 133 may include third and fourth transistors 133-1 and 133-2 and first and second resistors 133-3 and 133-4.

The third transistor 133-1 may have a source coupled to the power supply terminal VCCE and a drain coupled to the first output node D1.

The fourth transistor 133-2 may have a source coupled to the power supply terminal VCCE and a drain coupled to the second output node D11.

The first resistor 133-3 may have one end coupled to the drain of the third transistor 133-1 and the first output node D1 in common and the other end coupled to the gate of the third transistor 133-1 and the gate of the fourth transistor 133-2 in common.

The second resistor 133-4 may have one end coupled to the second output node D11 and the other end coupled to the gate of the third transistor 133-1 and the gate of the fourth transistor 133-2 in common.

The output terminal 135 may be coupled between the power supply terminal VCCE and the ground terminal, and drive the amplification signal AMP_OUT according to the voltage levels of the first and second output nodes D1 and D11.

The common mode feedback circuit 133 may feed voltage level changes of the first and second output nodes D1 and D11 back to the third and fourth transistors 133-1 and 133-2, using the first and second resistors 133-3 and 133-4, thereby reducing an offset between the first and second output nodes D1 and D11.

Figure 3:
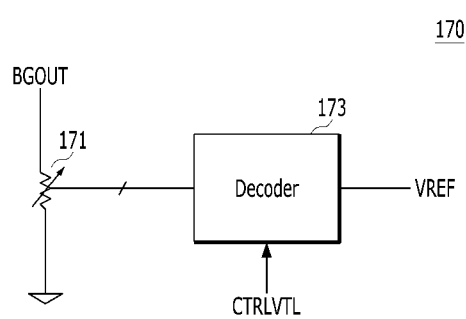
FIG. 3 is a diagram illustrating a configuration of a voltage control circuit, such as that of FIG. 1.

FIG. 3 is a diagram illustrating a configuration of the voltage control circuit 170 of FIG. 1.

Referring to FIG. 3, the voltage control circuit 170 may include a resistor 171 and a decoder 173.

The resistor 171 may be a variable resistor, the resistance value of which is controlled externally.

One end of resistor 171 may receive the pre-reference voltage BGOUT and the other end may be coupled to the ground terminal.

The resistor 171 may include a plurality of unit resistors coupled in series.

Different voltages may be applied to the different nodes defined by the plurality of unit resistors of the resistor 171, respectively.

The decoder 173 may output one of these different voltages as the reference voltage VREF according to the voltage control signal CTRLVTL.

Referring to FIGS. 1 to 3, the operation of the reference voltage generation circuit 100 having the above-described configuration is described as follows.

Each of the first current ICTAT1, the second current ICTAT2 and the fifth current ICTAT3 is a CTAT-type current that decreases as the ambient temperature rises.

Each of the third and fourth currents IPTAT1 and IPTAT2 is a PTAT-type current that increases as the ambient temperature rises.

Since the first and second resistors 111 and 112 are passive elements whose resistance values can be easily matched with each other, the resistance values of the first and second resistors 111 and 112 may be controlled to be the same value.

Since the first and second resistors 111 and 112 having the same resistance value are coupled to the collector of the first transistor 113 and the collector of the second transistor 114 through the first and second nodes A1 and A11, respectively, the amount of the third current IPTAT1 flowing through the first reference current path and the amount of the fourth current IPTAT2 flowing through the second reference current path may be controlled to be the same.

Since the third and fourth currents IPTAT1 and IPTAT2 are equal, the voltage levels of the first and second nodes A1 and A11 may be matched with each other, i.e., controlled to be the same.

The first feedback loop 161 may perform a negative feedback operation of feeding back the first current ICTAT1 having a characteristic opposite to each of the third and fourth currents IPTAT1 and IPTAT2 according to the amplification signal AMP_OUT. Through the negative feedback operation, the voltage levels of the first and second nodes A1 and A11 can be retained at a constant level regardless of temperature change.

The second feedback loop 162 may control the voltage levels of the bases of the first and second transistors 113 and 114 according to the second current ICTAT2 which is controlled by the amplification signal AMP_OUT.

Since the base of the first transistor 113 and the base of the second transistor 114 are coupled in common, the base of the first transistor 113 and the base of the second transistor 114 may be controlled by the same voltage.

The first feedback loop 161 may control the third and fourth currents IPTAT1 and IPTAT2 to be the same. The second feedback loop 162 may control the voltage levels of the bases of the first and second transistors 113 and 114 coupled to each other. That is, the second feedback loop 162 may control the absolute value of the amount of current flowing through the reference circuit 110.

As described with reference to FIG. 2, the amplifier circuit 130 may further suppress an occurrence of offset between the first and second output nodes D1 and D11, using the N-channel-input differential pair and the common mode feedback circuit 133.

Therefore, the pre-reference voltage BGOUT may be constantly retained regardless of temperature variation and/or variation in voltage level of the power supply terminal VCCE.

Since the pre-reference voltage BGOUT is constantly retained regardless of temperature variation and/or variation in voltage level of the power supply terminal VCCE, the reference voltage VREF may also be constantly retained regardless of any such change and/or variation.

Figure 4:
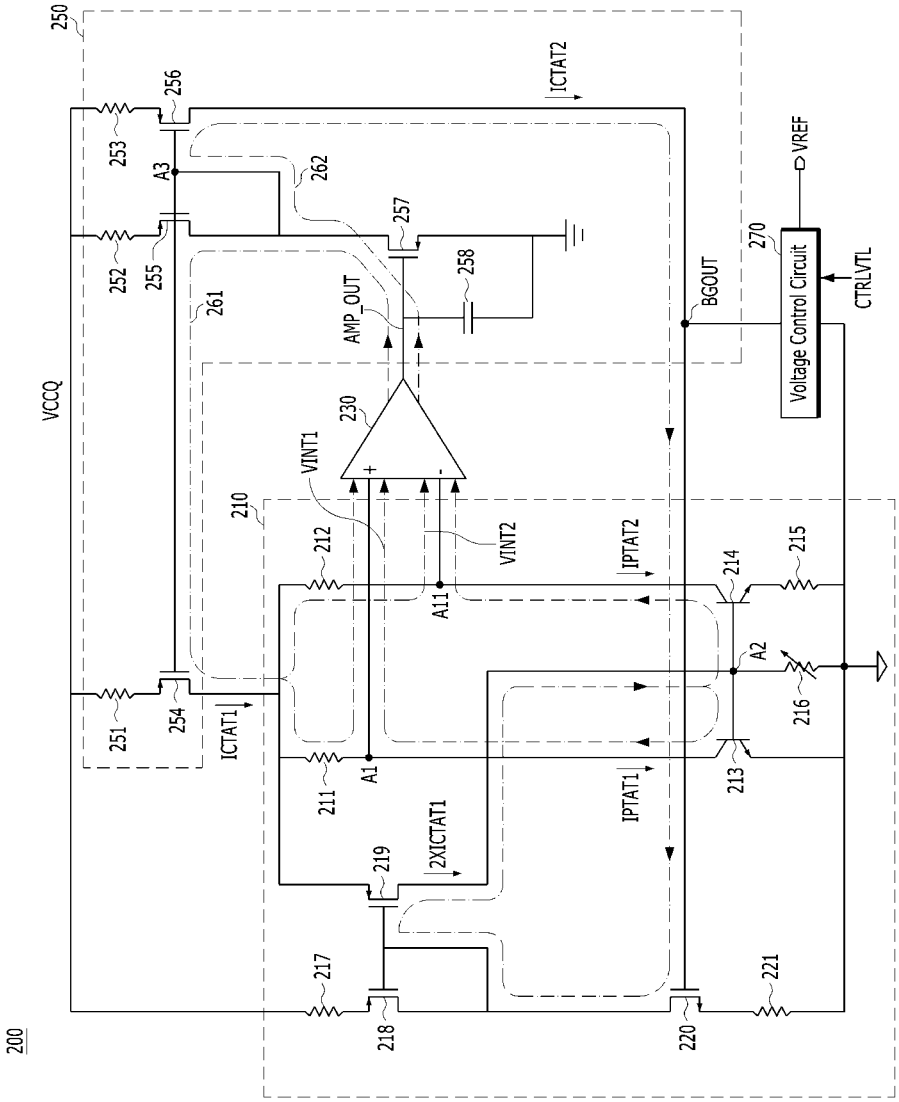
FIG. 4 is a diagram illustrating a configuration of a reference voltage generation circuit in accordance with an embodiment.

FIG. 4 is a diagram illustrating a configuration of a reference voltage generation circuit 200 in accordance with an embodiment.

In the embodiment described with reference to FIGS. 1 to 3, it has been exemplified that the reference voltage generation circuit 100 is applied to a semiconductor circuit using supply voltage VCCE, for example, a NAND flash memory.

In accordance with the present embodiment, it is exemplified that the reference voltage generation circuit is applied to a semiconductor circuit which uses a supply voltage VCCQ lower than VCCE, for example, an SoC NAND controller.

When VCCQ having a lower level than VCCE is used as a supply voltage, the pre-reference voltage BGOUT needs to be generated at a lower level than in the embodiment of FIG. 1. For reference, the voltage control circuit 170 of FIG. 1 and a voltage control circuit 270 of FIG. 4, which is described below, can control the level of the reference voltage VREF, but cannot lower the level of the reference voltage VREF to such a level that is required by a semiconductor circuit using VCCQ.

Therefore, the present embodiment provides a reference voltage generation circuit which can generate the reference voltage VREF at a level required by the semiconductor circuit using VCCQ. Hereafter, the reference voltage generation circuit 200 is described.

Referring to FIG. 4, the reference voltage generation circuit 200 may include a reference circuit 210, an amplifier circuit 230, a current control circuit 250 and a voltage control circuit 270.

The reference circuit 210 may generate a first internal voltage VINT1, a second internal voltage VINT2 and a pre-reference voltage BGOUT, each of which is controlled to be target a value, by compensating for an offset caused by temperature change and/or voltage change, according to a first current ICTAT1 and a second current ICTAT2.

The reference circuit 210 may include first to sixth resistors 211, 212, 215, 216, 217 and 221 and first to fifth transistors 213, 214, 218, 219 and 220.

The first resistor 211 may have one end coupled to the current control circuit 250 and configured to receive the first current ICTAT1 and the other end coupled to a first node A1.

The first internal voltage VINT1 may be applied to the first node A1.

The second resistor 212 may have one end coupled to the current control circuit 250 and configured to receive the first current ICTAT1 and the other end coupled to a second node A11.

The first and second resistors 211 and 212 may have the same resistance value.

The second internal voltage VINT2 may be applied to the second node A11.

Each of the first and second transistors 213 and 214 may be a BJT.

The first transistor 213 may have a collector coupled to the first node A1 and a base coupled to a third node A2.

The second transistor 214 may have a collector coupled to the second node A11 and a base coupled to the third node A2.

The third resistor 215 may have one end coupled to an emitter of the second transistor 214.

The fourth resistor 216 may be a variable resistor, the resistance value of which can be adjusted externally.

One end of the fourth resistor 216 may be coupled to the base of the first transistor 213 and the base of the second transistor 214 in common. The other end of the fourth resistor 216 may be coupled to a ground terminal and the emitter of the first transistor 213 in common.

The fifth resistor 217 may have one end coupled to a power supply terminal VCCQ.

The voltage of the power supply terminal VCCQ may be provided from an external source, and have a lower level than that of the power supply terminal VCCE of FIG. 1.

The third to fifth transistors 218 to 220 may be MOS transistors.

The third transistor 218 may have a source coupled to the other end of the fifth resistor 217 and a drain coupled to a gate thereof.

The fourth transistor 219 may have a source coupled to the current control circuit 250 and configured to receive the first current ICTAT1, a gate coupled to the gate of the third transistor 218, and a drain coupled to the third node A2.

The fifth transistor 220 may have a source coupled to the drain of the third transistor 218 and a gate coupled to the current control circuit 250.

The pre-reference voltage BGOUT may be applied to the gate of the fifth transistor 220.

The sixth resistor 221 may have one end coupled to the drain of the fifth transistor 220 and the other end coupled to the ground terminal.

A third current 2XICTAT1 flows through the fourth transistor 219.

A fourth current IPTAT1 flows through a current path formed through the first resistor 211, the first node A1 and the collector of the first transistor 213, which may be referred to as a first reference current path.

A fifth current IPTAT2 flows through a current path formed through the second resistor 212, the second node A11 and the collector of the second transistor 214, which may be referred to as a second reference current path.

Each of the first current ICTAT1, the second current ICTAT2 and the third current 2XICTAT1 is a CTAT-type current that decreases as the ambient temperature rises.

The third current 2XICTAT1 has CTAT-type but has different current variation ratio than the first current ICTAT1. The third current 2XICTAT1 may be twice that of the first current ICTAT1.

Each of the fourth current IPTAT1 and the fifth current IPTAT2 is a PTAT-type current that increases as the ambient temperature rises.

Since the first and second resistors 211 and 212 having the same resistance value are coupled to the collector of the first transistor 213 and the collector of the second transistor 214 through the first and second nodes A1 and A11, respectively, the amount of the fourth current IPTAT1 flowing through the first reference current path and the amount of the fifth current IPTAT2 flowing through the second reference current path may be controlled to be the same.

Since the fourth and fifth currents IPTAT1 and IPTAT2 are equal, the voltage levels of the first and second nodes A1 and A11 may be matched with each other, i.e., controlled to be the same.

The amplifier circuit 230 may amplify a voltage difference between the first and second internal voltages VINT1 and VINT2, and output an amplification signal AMP_OUT corresponding to the amplified voltage difference.

The amplifier circuit 230 may receive the first internal voltage VINT1 through a first input terminal (+) and receive the second internal voltage VINT2 through a second input terminal (−).

The amplifier circuit 230 may be configured in the same manner as in FIG. 2.

The current control circuit 250 may control the first and second currents ICTAT1 and ICTAT2 according to the amplification signal AMP_OUT.

The current control circuit 250 may include seventh to ninth resistors 251 to 253, sixth to ninth transistors 254 to 257 and a capacitor 258.

The sixth to ninth transistors 254 to 257 may be MOS transistors.

An upstream end of each of the seventh to ninth resistors 251 to 253 may be coupled to the power supply terminal VCCQ in common.

The sixth transistor 254 may have a source coupled to the downstream end of the seventh resistor 251 and a drain coupled to the first resistor 211 of the reference circuit 210.

The seventh transistor 255 may have a source coupled to the downstream end of the eighth resistor 252 and a drain coupled to a fourth node A3.

The eighth transistor 256 may have a source coupled to the downstream end of the ninth resistor 253 and a drain coupled to the third node A2 of the reference circuit 210.

The gates of the sixth to eighth transistors 254 to 256 may be coupled to the fourth node A3 in common.

The ninth transistor 257 may have a drain coupled to the drain of the seventh transistor 255, a source coupled to the ground terminal, and a gate coupled to an output terminal of the amplifier circuit 230 and configured to receive the amplification signal AMP_OUT.

The capacitor 258 may be coupled between the gate and source of the ninth transistor 257.

The voltage control circuit 270 may generate the reference voltage VREF by controlling the level of the pre-reference voltage BGOUT according to the voltage control signal CTRLVTL.

The voltage control circuit 270 may be coupled between the ground terminal and a node to which the pre-reference voltage BGOUT is applied.

The voltage control circuit 270 may be configured in the same manner as FIG. 3.

The reference voltage generation circuit 200 in accordance with the present embodiment may form a first feedback loop 261 and a second feedback loop 262.

The reference voltage generation circuit 200 may control the first to third currents ICTAT1, ICTAT2 and 2XICTAT by driving the first and second feedback loops 261 and 262 according to the amplification signal AMP_OUT. Through the control of the reference voltage generation circuit 200, the reference voltage VREF has a constant level regardless of a temperature change and a variation in supply voltage.

The first feedback loop 261 may be constituted by components 257, 255 and 254 of the current control circuit 250, components 211 and 212 of the reference circuit 210, and the amplifier circuit 230.

The second feedback loop 262 may be constituted by components 257 and 256 of the current control circuit 250, components 213, 214, 220, 218 and 219 of the reference circuit 210, and the amplifier circuit 230.

The operation of the reference voltage generation circuit 200 in accordance with the present embodiment, which has the above-described configuration, is described as follows.

Each of the first current ICTAT1, the second current ICTAT2 and the third current 2XICTAT1 is a CTAT-type current that decreases as the ambient temperature rises.

The third current 2XICTAT1 may be twice that of the first current ICTAT1.

Each of the fourth current IPTAT1 and the fifth current IPTAT2 is PTAT-type current that increases as the ambient temperature rises.

Since the first and second resistors 211 and 212 are passive elements whose resistance values can be easily matched with each other, the resistance values of the first and second resistors 211 and 212 may be controlled to be the same value.

Since the first and second resistors 211 and 212 having the same resistance value are coupled to the collector of the first transistor 213 and the collector of the second transistor 214 through the first and second nodes A1 and A11, respectively, the amount of the fourth current IPTAT1 flowing through the first reference current path and the amount of the fifth current IPTAT2 flowing through the second reference current path may be controlled to be the same.

Since the fourth and fifth currents IPTAT1 and IPTAT2 are equal, the voltage levels of the first and second nodes A1 and A11 may be matched with each other, i.e., controlled to be the same.

The first feedback loop 261 may perform a negative feedback operation of feeding back the first current ICTAT1 having the opposite characteristic to the fourth and fifth currents IPTAT1 and IPTAT2 according to the amplification signal AMP_OUT. Through the negative feedback operation, the voltage levels of the first and second nodes A1 and A11 can be matched with each other regardless of temperature variation.

The second feedback loop 262 may control the voltage levels of the bases of the first and second transistors 213 and 214 according to the third current 2XICTAT1 generated through the second current ICTAT2, which is controlled by the amplification signal AMP_OUT.

Since the base of the first transistor 213 and the base of the second transistor 214 are coupled in common, the base of the first transistor 213 and the base of the second transistor 214 may be controlled by the same voltage.

The first feedback loop 261 may control the fourth and fifth currents IPTAT1 and IPTAT2 to be the same. The second feedback loop 262 may control the voltage levels of the bases of the first and second transistors 213 and 214 coupled to each other. That is, the second feedback loop 262 may control the absolute value of the amount of current flowing through the reference circuit 210.

The second feedback loop 262 may negatively feed back the third current 2XICTAT1 which is twice that of the first current ICTAT1. Thus, the second feedback loop 262 may lower the level of the pre-reference voltage BGOUT to a desired level, compared to the embodiment described with reference to FIG. 1.

In accordance with the embodiment of FIG. 4, the third to fifth transistors 218 to 220 may be configured to generate the third current 2XICTAT1 which is twice that of the first current ICTAT1, and the second feedback loop 262 may be configured to negatively feed the third current 2XICTAT1 back to the paths of the fourth and fifth currents IPTAT1 and IPTAT2. Thus, the second feedback loop 262 may lower the level of the pre-reference voltage BGOUT to a desired level, compared with the embodiment described with reference to FIG. 1.

As described with reference to FIG. 2, the amplifier circuit 230 may further suppress an occurrence of offset between the first and second output nodes D1 and D11.

Therefore, the pre-reference voltage BGOUT may be constantly retained regardless of temperature change and/or variation in voltage level of the power supply terminal VCCQ.

Since the pre-reference voltage BGOUT is constantly retained regardless of temperature change and/or variation in voltage level of the power supply terminal VCCQ, the reference voltage VREF may also be constantly retained regardless of any such change and/or variation.

While various embodiments have been illustrated and described, it will be understood to those skilled in the art that the embodiments described are examples only. Accordingly, the present invention is not limited by or to any of the disclosed embodiments. Rather, the present invention encompasses all variations and modifications of any of the disclosed embodiments that fall within the scope of the claims.

What is claimed is:

1. A reference voltage generation circuit comprising:
a first reference current path formed through a first node and a first transistor;
a second reference current path formed through a second node and a second transistor;
a first feedback loop configured to feed back a first current having a characteristic opposite that of each of currents flowing through the first and second reference current paths, such that voltage levels of the first and second nodes are retained at a constant level regardless of temperature change; and
a second feedback loop configured to control currents flowing through the first and second transistors according to a second current.

2. The reference voltage generation circuit according to claim 1, wherein the first reference current path comprises:
a first resistor having one end configured to receive the first current and the other end coupled to the first node; and
the first transistor having a collector coupled to the first node and an emitter coupled to a ground terminal.

3. The reference voltage generation circuit according to claim 2, wherein the second reference current path comprises:
a second resistor having one end configured to receive the first current and the other end coupled to the second node; and
the second transistor having a collector coupled to the second node, an emitter coupled to the ground terminal, and a base coupled to a base of the first transistor and configured to receive the second current.

4. The reference voltage generation circuit according to claim 1, further comprising an amplifier circuit configured to amplify a difference in voltage between the first and second nodes, and output an amplification signal for adjusting the first and second currents.

5. The reference voltage generation circuit according to claim 1, further comprising a voltage control circuit configured to generate a reference voltage by controlling a level of a pre-reference voltage outputted from a node of the second feedback loop according to a voltage control signal.

6. The reference voltage generation circuit according to claim 1, wherein each of the first and second currents has a characteristic corresponding to any one of a proportion to absolute temperature (PTAT)-type current and a complementary to absolute temperature (CTAT)-type current, and each of a third current flowing through the first reference current path and a fourth current flowing through the second reference current path has a characteristic corresponding to the other of the PTAT-type current and the CTAT-type current.

7. A reference voltage generation circuit comprising:
a reference circuit configured to generate a first internal voltage, a second internal voltage and a pre-reference voltage, each of which is controlled to be a target value, by compensating for an offset caused by at least one of temperature change and voltage change, according to a first current and a second current;
an amplifier circuit configured to amplify a voltage difference between the first and second internal voltages, and output an amplification signal; and
a current control circuit configured to control the first and second currents according to the amplification signal,
wherein components of the current control circuit, the reference circuit and the amplifier circuit form:
a first feedback loop configured to feed back the first current having a characteristic opposite that of each of currents flowing through first and second nodes, such that voltage levels of the first and second nodes are retained at a constant level regardless of temperature change; and
a second feedback loop configured to control a current flowing through the reference circuit according to the second current.

8. The reference voltage generation circuit according to claim 7, wherein the reference circuit comprises:
a first resistor having one end configured to receive the first current and the other end coupled to a first node;
a first transistor having a collector coupled to the first node and an emitter coupled to a ground terminal;
a second resistor having one end configured to receive the first current and the other end coupled to a second node; and
a second transistor having a collector coupled to the second node, an emitter coupled to the ground terminal, and a base coupled to a base of the first transistor and configured to receive the second current.

9. The reference voltage generation circuit according to claim 8, wherein the pre-reference voltage is outputted from a node to which the base of the first transistor and the base of the second transistor are coupled.

10. The reference voltage generation circuit according to claim 7, wherein each of the first and second currents has a characteristic corresponding to any one of a proportion to absolute temperature (PTAT)-type current and a complementary to absolute temperature (CTAT)-type current, and each of a current flowing through a first node to which the first internal voltage is applied and a current flowing through a second node to which the second internal voltage is applied has a characteristic corresponding to the other of the PTAT-type current and the CTAT-type current.

11. The reference voltage generation circuit according to claim 7, further comprising a voltage control circuit configured to generate a reference voltage by controlling a level of the pre-reference voltage according to a voltage control signal.

12. A reference voltage generation circuit comprising:
a reference circuit configured to generate a first internal voltage, a second internal voltage and a pre-reference voltage, each of which is controlled to be a target value, by compensating for an offset caused by at least one of temperature change and voltage change, according to a first current and a second current, each of which has a first characteristic, and a third current which has the first characteristic but has a different current variation ratio than either of the first and second currents;

an amplifier circuit configured to amplify a voltage difference between the first and second internal voltages, and output an amplification signal; and a current control circuit configured to control the first and second currents according to the amplification signal, wherein components of the current control circuit, the reference circuit and the amplifier circuit form:

a first feedback loop configured to feed back the first current having a characteristic opposite that of each of currents flowing through first and second nodes, such that voltage levels of the first and second nodes are retained at a constant level regardless of temperature change; and a second feedback loop configured to control a current flowing through the reference circuit according to the second current.

13. The reference voltage generation circuit according to claim 12, wherein the reference circuit comprises:

a first resistor having one end configured to receive the first current and the other end coupled to a first node; and a first transistor having a collector coupled to the first node and an emitter coupled to a ground terminal;

a second resistor having one end configured to receive the first current and the other end coupled to a second node;

a second transistor having a collector coupled to the second node, an emitter coupled to the ground terminal, and a base coupled to a base of the first transistor and configured to receive the second current;

a third transistor having a source coupled to a power supply terminal and a drain coupled to a gate thereof;

a fourth transistor having a source configured to receive the first current and a gate coupled to a gate of the third transistor; and a fifth transistor having a source coupled to the drain of the third transistor.

14. The reference voltage generation circuit according to claim 13, wherein the third current flows through the fourth transistor.

15. The reference voltage generation circuit according to claim 13, wherein a voltage applied to a gate of the fifth transistor is outputted as the pre-reference voltage.

16. The reference voltage generation circuit according to claim 12, wherein the first characteristic corresponds to any one of a proportion to absolute temperature (PTAT)-type current and a complementary to absolute temperature (CTAT)-type current, and each of a current flowing through the first node to which the first internal voltage is applied and a current flowing through the second node to which the second internal voltage is applied has a second characteristic corresponding to the other of the PTAT-type current and the CTAT-type current.

17. The reference voltage generation circuit according to claim 12, further comprising a voltage control circuit configured to generate a reference voltage by controlling the level of the pre-reference voltage according to a voltage control signal.

* * * * *